United States Patent [19]

Tsurushima

[11] 3,912,981

[45] Oct. 14, 1975

[54] PROTECTIVE CIRCUIT FOR FIELD EFFECT TRANSISTOR AMPLIFIER

[75] Inventor: Katsuaki Tsurushima, Kawasaki, Japan

[73] Assignee: Sony Corporation, Tokyo, Japan

[22] Filed: Sept. 30, 1974

[21] Appl. No.: 510,782

[30] Foreign Application Priority Data

Oct. 5, 1973 Japan .............................. 48-111995

[52] U.S. Cl. ........ 317/33 R; 317/33 SC; 330/207 P; 307/202 R

[51] Int. Cl.$^{2}$........................ H02H 7/20; H02H 9/04

[58] Field of Search ....................... 317/33 R, 33 SC; 307/202 R; 330/207 P

[56] References Cited

UNITED STATES PATENTS

| | | | |
|---|---|---|---|
| 3,526,810 | 9/1970 | Williams et al. | 317/33 R X |
| 3,536,958 | 10/1970 | Sondermeyer | 317/33 R |
| 3,544,845 | 12/1970 | Spyrou | 317/33 R |
| 3,599,042 | 8/1971 | Andrews, Jr. | 307/202 R X |
| 3,777,216 | 12/1972 | Armstrong | 317/33 SC X |
| 3,792,316 | 2/1974 | Bondini et al. | 317/33 R X |
| 3,819,952 | 6/1974 | Enomoto et al. | 307/202 R X |

*Primary Examiner*—L. T. Hix
*Attorney, Agent, or Firm*—Lewis H. Eslinger; Alvin Sinderbrand

[57] ABSTRACT

A transistor amplifier which includes at least one field effect transistor for amplifying an input signal and supplying a corresponding output signal to a load, and a biasing circuit for supplying a predetermined biasing voltage to the field effect transistor so as to operate the latter with a suitable biasing current, is protected against overloading of such transistor by a detecting circuit for detecting an overload condition of the field effect transistor, and a switching circuit operative to maintain the biasing voltage at a predetermined value and to shunt the input signal to the load when an output signal of the detecting circuit exceeds a predetermined value. In a preferred embodiment, the output stage of the amplifier is constituted by a push-pull amplifier having at least a pair of field effect transistors with triode characteristics so as to have excellent characteristics, such as, low switching distortion, high linearity and low output impedance, and thereby be particularly suited for use as an audio power amplifier. Further, the detecting circuit is preferably of the load impedance detecting type, for example, responsive to both the load current and the load voltage, so as to avoid misoperation of the protective circuit, that is, unnecessary shunting of the input signal to the load, as when the latter is constituted by a condenser speaker.

29 Claims, 6 Drawing Figures

PROTECTIVE CIRCUIT FOR FIELD EFFECT TRANSISTOR AMPLIFIER

BACKGROUND OF THE INVENTION

1. Field of the Invention

This invention relates generally to a protective circuit for a transistor amplifier, and more particularly is directed to an improved protective circuit for a field effect transistor amplifier without misoperation.

2. Description of the Prior Art

Many protective circuits have been proposed for use with transistor amplifiers employing bipolar transistors. However, few protective circuits are concerned with field effect transistor amplifiers in which a field effect transistor is used as a power amplifier, because the usual field effect transistor with pentode characteristics is not suited for operation as a power amplifier.

Recently, field effect transistors with triode characteristics have been developed which are effective for use in a power amplifier because of the relatively higher current and breakdown voltage ratings thereof. Therefore, it has become necessary to provide a new protective circuit for amplifiers employing one or more field effect transistors with triode characteristics for amplifying purposes.

In general, a field effect transistor has different characteristics than a bipolar transistor, particularly in that a maximum drain current flows in the absence of any DC biasing voltage applied between the gate and source electrodes of the field effect transistor. By reason of the foregoing, a protective circuit provided for bipolar transistor cannot be used for a field effect transistor amplifier, particular when the field effect transistors of the latter have triode characteristics.

SUMMARY OF THE INVENTION

Accordingly, it is an object of the present invention to provide an improved protective circuit for a transistor amplifier, and which is particularly adapted for use with an amplifier using one or more field effect transistors for amplifying purposes.

Another object is to provide a protective circuit for a field effect transistor amplifier which is effective for use as an audio power amplifier.

A further object is to provide a protective circuit for a field effect transistor amplifier which is of the push-pull type.

A still further object is to provide a protective circuit for a transistor amplifier in which one or more field effect transistors with triode characteristics are used for amplifying purposes.

In accordance with an aspect of this invention, a transistor amplifier which includes one or more field effect transistors for amplifying an input signal applied thereto, as from a driving stage, and supplying a corresponding amplified output signal to a load, and a biasing circuit for supplying a predetermined biasing voltage to each such transistor so as to operate the latter with a suitable biasing current, is protected against overloading of each amplifying transistor by the provision of a detecting circuit for detecting an overload condition of each amplifying transistor, and a switching circuit operative to maintain the biasing voltage at a predetermined value and to shunt the input signal to the load when the detecting circuit detects the overload condition.

In a preferred embodiment of the invention, the detecting circuit detects the current through, and the voltage across the load, that is, the load impedance, and the switching circuit is made operative, as aforesaid, when the load impedance declines below a predetermined value, for example, in response to a short circuit in the load. Thus, the switching circuit is not made operative to shunt the input signal to the load when only the load current is substantially increased, but without a correspondingly large decrease in the load impedance, as in the case where the load is a condenser speaker which has a large reactive component in addition to a resistive component, whereby to prevent overprotection of the field effect transistors and consequent mis-operation of the amplifier.

The above, and other objects, features and advantages of the invention, will be apparent from the following detailed description of an illustrative embodiment which is to be read in connection with the accompanying drawings.

DESCRIPTION OF THE PREFERRED EMBODIMENTS

A field effect transistor with triode characteristics that is suitable for use in a transistor amplifier having a protective circuit according to the present invention will first be described with reference to FIG. 1.

Figure 1:
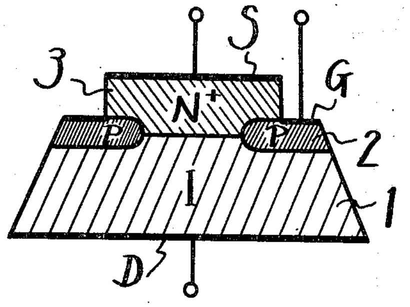
FIG. 1 is a sectional view showing an example of a field effect transistor with triode characteristics that may be used in a transistor amplifier having a protective circuit according to the present invention.

As shown in FIG. 1, a field effect transistor with triode characteristics may include an intrinsic semiconductor region 1 of low impurity concentration and high resistance which has thereon an annular P-type semiconductor region 2 formed by a selective diffusion method or the like. An N-type semiconductor region 3 of high impurity concentration spreading over the intrinsic semiconductor region 1 and the P-type semiconductor region 2 is formed by an epitaxial method or the like. A drain electrode D is provided at the bottom of intrinsic semiconductor region 1, a gate electrode G is provided on P-type semiconductor region 2, and a source electrode S is provided on the upper surface of N-type semiconductor region 3.

Figure 2:
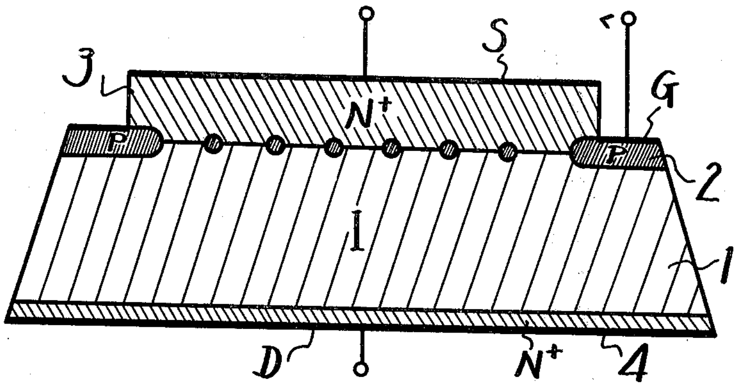
FIG. 2 is a sectional view showing another example of a field effect transistor with triode characteristics that may be used in a transistor amplifier having a protective circuit according to the present invention.

Referring now to FIG. 2, in which elements corresponding to those described above with reference to FIG. 1 are identified by the same reference numerals, it will be seen that, in a preferred type of field effect transistor with triode characteristics suitable for use in transistor amplifiers having a protective circuit according to this invention, the P-type semiconductor region 2 is formed in a mesh-like configuration, and an N-type semiconductor region 4 of high impurity concentration is provided under the lower surface of the intrinsic semiconductor region for increasing the breakdown voltage between the drain and source electrodes D and S.

In the field effect transistors of FIGS. 1 and 2, increasing the gate voltage (negatively) causes growth of depletion layers from the portions of gate region 2 that extend between regions 1 and 3 and the channel is formed in region 3 between such gate portions. Since region 3 is shown to be of N-type conductivity, the field effect transistors illustrated on FIGS. 1 and 2 are N-channel transistors, however, it will be apparent that similar field effect transistors may be provided with the regions 2 and 3 thereof being of N-type and P-type conductivities, respectively, so as to be P-channel field effect transistors.

In any case, it will be apparent that each of the illustrated field effect transistors has a vertical channel, rather than a lateral channel as in a conventional field effect transistor. By reason of such vertical channel, both the distance between the source electrode S and the channel and the length of the channel itself are very small so that the field effect transistor has a very low output resistance or impedance, for example, on the order of about 10 ohms, which is not varied in response to voltage fluctuations. It is a feature of field effect transistors of the type shown on FIGS. 1 and 2 that the drain current thereof does not become saturated in response to increasing of the voltage between the drain and source. As shown on FIG. 3, by way of example, in which the abscissa indicates drain voltage $V_D$ in volts (V) and the ordinate indicates drain current $I_D$ in milliampere (mA), with gate voltage $V_G$ in volts (V) being used as a parameter, the drain voltage-drain current characteristic curves of a field effect transistor with a vertical channel, such as is shown on FIGS. 1 and 2, are similar to those of a triode so that the illustrated field effect transistor can be said to have triode characteristics. More particularly, it will be seen that the drain voltage-drain current characteristic curves of FIG. 3, being similar to those of a triode, are straight for substantial portions of their lengths with such straight portions being steeply inclined and substantially parallel, to indicate a low output impedance which is substantially not varied with voltage fluctuations and the capacity to provide a large output of excellent linearity and relatively low distortion.

As distinguished from the foregoing, in a conventional junction type field effect transistor having a lateral channel, the resistance between the source electrode and the channel, the resistance of the channel itself and the resistance between the channel and the drain electrode are all large with the result that the output resistance or impedance of the conventional field effect transistor is very high, for example, on the order of several meg-ohms, so as to exhibit so-called pentode characteristics. Accordingly, with the conventional field effect transistor having pentode characteristics, as the voltage applied to its drain electrode increases, the drain voltage-drain current characteristics of such transistor tend to cause saturation of the drain current at a predetermined value of the drain voltage.

Figure 3:
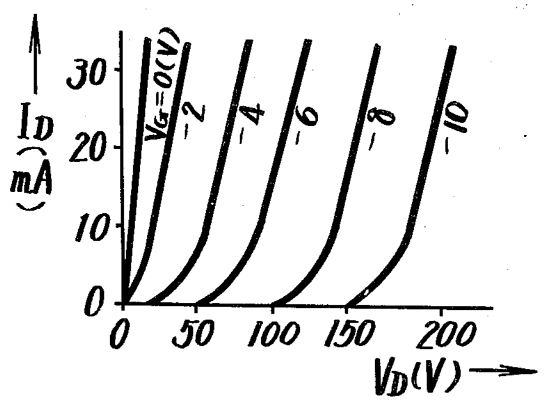
FIG. 3 is a graph illustrating typical output characteristics of a field effect transistor of the types shown in FIG. 1 and FIG. 2.
Figure 4:
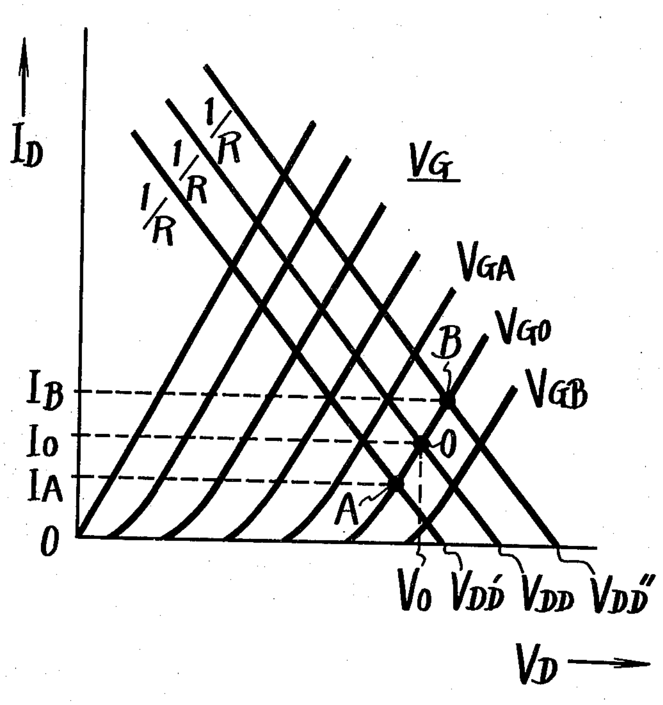
FIGS. 4 and 5 are graphs to which reference will be made in explaining the present invention.

Referring now to FIG. 4, in which the abscissa indicates drain voltage $V_D$, the ordinate indicates drain current $I_D$, and the gate voltage $V_G$ is again used as a parameter, as in FIG. 3, it will be seen that the drain voltage-drain current characteristic curves for a field effect transistor with triode characteristics, when used as the amplifying element in an amplifier, are similar to those shown on FIG. 3. If the gate voltage $V_G$ is assumed to be $V_{GO}$, and a load line having a gradient 1/R is drawn from a base or normal voltage $V_{DD}$ applied to the drain from a suitable source so as to intersect the drain voltage-drain current curve for the gate voltage $V_{GO}$ at the point O, such point O can be considered the normal operating point corresponding to a drain DC biasing current $I_o$. However, if the voltage applied from the voltage source to the drain fluctuates from the base or normal value $V_{DD}$, for example, to the relatively lower value $V'_{DD}$ or the higher value $V''_{DD}$, the load line having the gradient 1/R shifts, as shown, to have the base point $V'_{DD}$ or $V''_{DD}$, respectively, and to intersect the characteristic curve for the gate voltage $V_{GO}$ at the point A or B, whereby the drain DC biasing current changes to the value $I_A$ or $I_B$, respectively. The foregoing characteristic of field effect transistors with triode characteristics is obviously disadvantageous in an audio output amplifier in that it introduces distortions in the amplified output in response to fluctuations in the operating voltage source.

Figure 5:
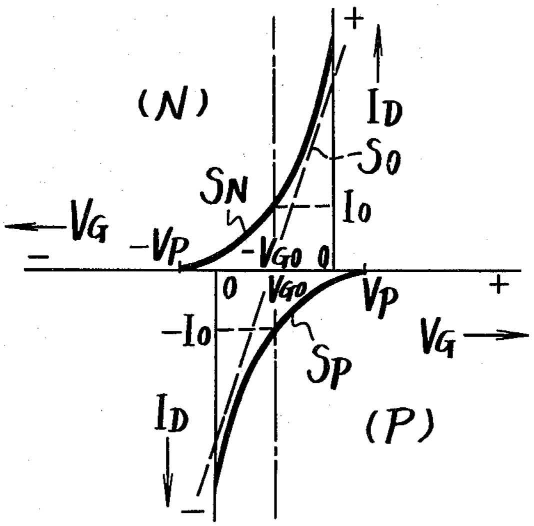

The above disadvantage of field effect transistors with triode characteristics is accentuated when such N-channel and P-channel transistors are employed in an audio output amplifier of the pure complementary push-pull type or AB-class. In that case, the N-channel and P-channel transistors with triode characteristics are selected to have gate voltage-drain current curves with remote cut-off characteristics. For example, as shown on FIG. 5, the N-channel and P-channel transistors for use is such an audio output amplifier may have the gate voltage ($V_G$)-drain current ($I_D$) curves shown in full lines at $S_N$ and $S_P$, respectively. When the gate voltages applied to the N-channel and P-channel transistors have the values $-V_{GO}$ and $V_{GO}$, respectively, the composite characteristic curve is, for example, as indicated in broken lines at $S_o$ on FIG. 5. However, when the DC biasing drain current of each of the transistors is lowered from $I_o$ to $I_A$ due to fluctuation of the voltages applied to the drains from the voltage source, as described above with reference to FIG. 4, a step is formed in the composite characteristic curve $S_o$ at the point of zero drain current, with the result that a cross-over distortion is introduced.

It has been proposed to avoid the foregoing problem in AB-class push-pull amplifiers, as well as in any other type of amplifier employing one or more field effect transistors with triode characteristics for amplifying purposes, by suitably varying a DC bias voltage applied to the gate electrode of each such transistor in response to variations or fluctuations in the drain voltage, that is, the operating voltage for the transistor, whereby to maintain constant the DC biasing drain current in spite of such fluctuations. For example, as shown on FIG. 4, if the operating voltage fluctuates from its normal value $V_{DD}$ to a reduced value $V'_{DD}$ so as to vary the drain current from $I_o$ to $I_A$, the drain current is restored to its value $I_o$ by reducing the gate voltage from the value $V_{GO}$ to the value $V_{GA}$ which corresponds to the drain voltage-drain current curve intersected at the drain current value $I_o$ by the load line extending from the voltage $V'_{DD}$. Conversely, as also shown on FIG. 4, if the operating voltage fluctuates from its normal value $V_{DD}$ to an increased value $V''_{DD}$ so as to change the drain current from $I_o$ to $I_B$, the drain current is restored to its value $I_o$ by increasing the gate voltage from the value $V_{GO}$ to the value $V_{GB}$ which corresponds to the drain voltage-drain current curve intersected at the drain current value $I_o$ by the load line extending from the voltage $V''_{DD}$.

Figure 6:
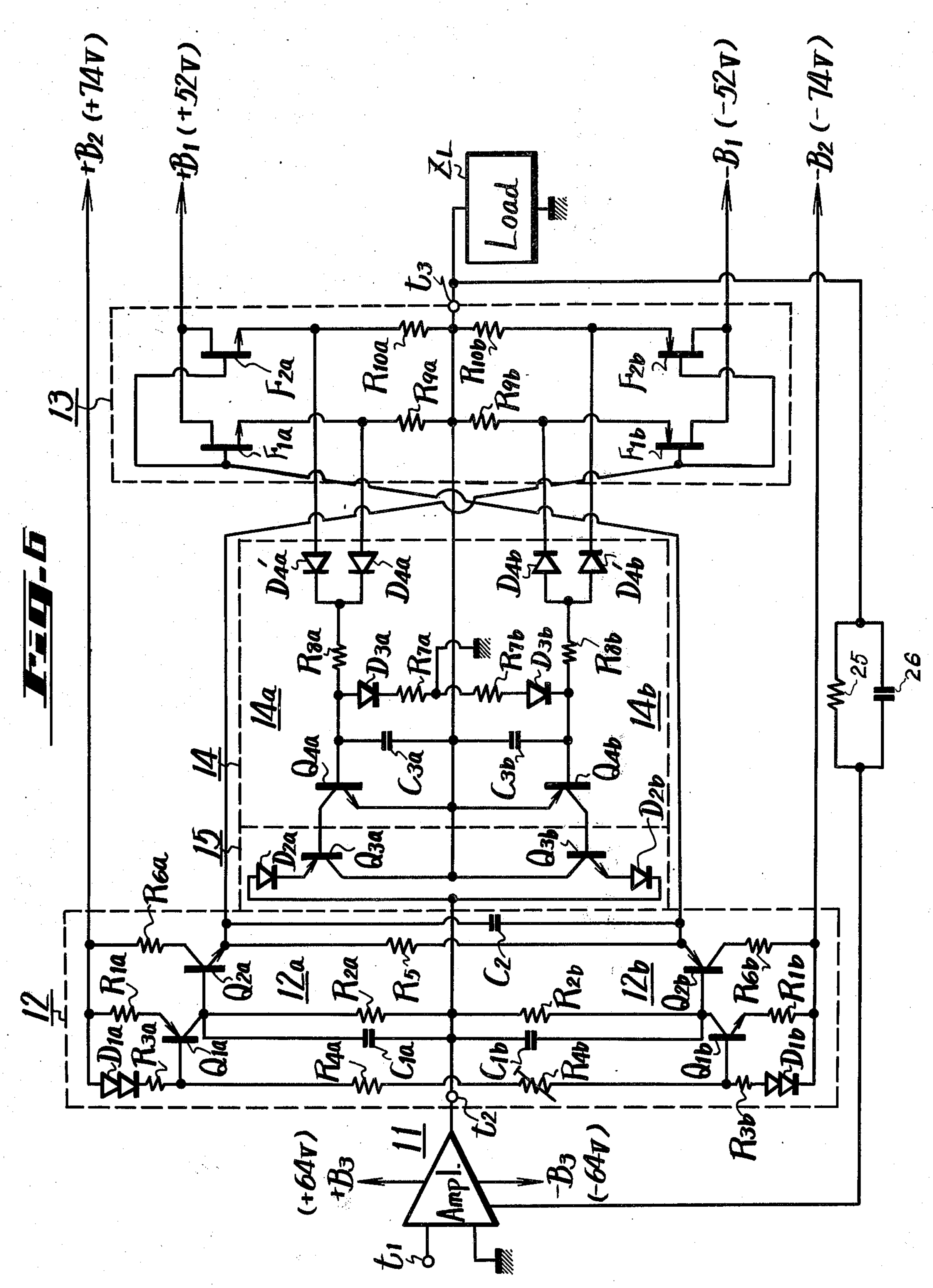
FIG. 6 is a circuit diagram showing a field effect transistor amplifier having a protective circuit according to an embodiment of the present invention.

Referring now to FIG. 6, it will be seen that an amplifier of the type to which this invention relates may generally comprise a driving stage 11, for example, in the form of a conventional A-class amplifier, having an input terminal $t_1$ and an output terminal $t_2$, a pure complementary push-pull output stage 13 employing field effect transistors with triode characteristics for amplifying purposes, and a biasing circuit 12 which is arranged to compensate for fluctuations in the operating voltage applied from a suitable voltage source to the field effect transistor with triode characteristics in output sstage 13.

A negative feedback signal may be supplied from the output of output stage 13 to the amplifier constituting driving stage 11 by way of a parallel circuit of a resistor 25 and capacitor 26, as shown. Further, a resistor (not shown) may be connected between output terminal $t_2$ of driving stage 11 and ground to establish a reference potential of biasing circuit 12. The driving stage 11 is operated by suitable voltages applied thereto from voltage source terminals $+B_3$ and $-B_3$. It will be apparent that an input signal applied to input terminal $t_1$ of the A-class amplifier constituting driving stage 11 is amplified by the latter to provide an output signal at terminal $t_2$ having a sufficient gain for driving the push-pull output stage 13.

The illustrated pure complementary push-pull output stage 13 is shown to generally include a pair of N-channel field effect transistors with triode characteristics, as indicated at $F_{1a}$ and $F_{2a}$, and a pair of P-channel field effect transistors with triode characteristics, as indicated at $F_{1b}$ and $F_{2b}$, with parallel push-pull connections between such transistors. More specifically, as shown, the drain electrodes of N-channel transistors $F_{1a}$ and $F_{2a}$ are connected to a terminal $+B_1$ of a voltage source whose other terminal is constituted by the ground, while the source electrodes of transistors $F_{1a}$ and $F_{2a}$ are connected through resistors $R_{9a}$ and $R_{10a}$ of relatively low resistance to an output terminal $t_3$ of output stage 13 and thence through a load $Z_L$, which may be constituted by a speaker to the ground. The P-channel transistors $F_{1b}$ and $F_{2b}$ have their drain electrodes connected to a terminal $-B_1$ of a voltage source whose other terminal is again constituted by ground, and the source electrodes of transistors $F_{1b}$ and $F_{2b}$ are connected through resistors $R_{9b}$ and $R_{10b}$, respectively, to output terminal $t_3$ and thence through load $Z_L$ to the ground.

The biasing circuit 12 is shown to be composed of a first biasing circuit 12*a* for supplying a biasing voltage to transistors $F_{1b}$ and $F_{2b}$, and a second biasing circuit 12*b* for supplying a biasing voltage to the transistors $F_{1a}$ and $F_{2a}$, with such biasing voltages being similar to the pinch-off voltages of the respective transistors. The biasing circuits 12*a* and 12*b* form a constant current circuit, and further function to compensate for fluctuations in the voltages applied from the voltage source terminals $+B_1$ and $-B_1$ to the drain electrodes of the transistors $F_{1a}$ and $F_{2a}$ and of the transistors $F_{1b}$ and $F_{2b}$, respectively.

As shown on FIG. 6, the biasing circuit 12*a* includes a PNP-type bipolar transistor $Q_{1a}$ having its emitter electrode connected through a resistor $R_{1a}$ to a voltage source terminal $+B_2$, while the collector electrode of transistor $Q_{1a}$ is connected through a parallel connection of a resistor $R_{2a}$ and a capacitor $C_{1a}$ to output terminal $t_2$ of the driving stage 11. The base electrode of transistor $Q_{1a}$ is connected through a series circuit of a resistor $R_{4a}$ and a variable resistor $R_{4b}$ to the base electrode of an -NPN-type bipolar transistor $Q_{1b}$ which is included in the second biasing circuit 12*b*. The base electrode of transistor $Q_{1a}$ is also connected through a resistor $R_{3a}$ to the cathode of a diode $D_{1a}$ which has its anode connected to voltage source terminal $+B_2$. The variable resistor $R_{4b}$ is adjustable to relatively vary the gate biasing voltages of transistors $F_{1a}$ and $F_{1b}$ and of transistors $F_{2a}$ and $F_{2b}$. Biasing circuit 12*a* is further shown to include an NPN-type bipolar transistor $Q_{2a}$ for impedance conversion which has its base electrode connected to the collector electrode of transistor $Q_{1a}$. The collector electrode of transistor $Q_{2a}$ is connected to voltage source terminal $+B_2$ through a resistor $R_{6a}$, and the emitter electrode of transistor $Q_{2a}$ is connected to the gate electrodes of transistors $F_{1b}$ and $F_{2b}$. Further, the emitter electrode of transistor $Q_{2a}$ is connected through a parallel connection of a resistor $R_5$ and a capacitor $C_2$ to the emitter electrode of PNP-type bipolar transistor $Q_{2b}$ which is also included in the second biasing circuit 12*b*.

In the second biasing circuit 12*b*, the NPN-type transistor $Q_{1b}$ has its emitter electrode connected through a resistor $R_{1b}$ to a voltage source terminal $-B_2$, while its collector electrode is connected to the base electrode of the transistor $Q_{2b}$ and also through a parallel connection of a resistor $R_{2b}$ and a capacitor $C_{1b}$ to the output terminal $t_2$ of driving stage 11. The base electrode of transistor $Q_{1b}$ is connected through a resistor $R_{3b}$ to the anode of a diode $D_{1b}$, while the cathode of such diode is connected to the voltage source terminal $-B_2$. Further, the PNP-type transistor $Q_{2b}$ for impedance conversion or amplification has its collector electrode connected through a resistor $R_{6b}$ to the voltage source terminal $-B_2$, and its emitter electrode is connected to the gate electrodes of transistors $F_{1a}$ and $F_{2a}$.

In the embodiment illustrated on FIG. 6, the voltage source terminals $+B_3$ and $-B_3$ may respectively provide +64V. DC and −64V. DC which, as described above, are applied to driving stage 11 as the operating voltages for the latter, and which are required to be constant or stabilized.

The voltage source terminals $+B_1$, $+B_2$, $-B_1$ and $-B_2$ may provide nominal DC voltages of +52V., +75V., −52V. and −74V., respectively, which are not stabilized so that considerable ripple components may appear therein in response to variations in the load current. However, the voltage source terminals $+B_1$, $+B_2$, $-B_1$ and $-B_2$ are provided on a common voltage source circuit (not shown) so that equal voltage fluctuations will normally occur simultaneously at such voltage source terminals. In other words, an increase in the positive voltage at terminal $+B_1$ from its nominal value of +52V., for example, will be accompanied by an equal increase, in the positive direction, in the voltage at terminal $+B_2$ and by equal increases, in the negative direction, in the voltages at terminals $-B_1$ and $-B_2$.

With the above described arrangement in biasing circuit 12, the biasing circuits 12*a* and 12*b* are symmetrical with respect to output terminal $t_2$ of driving stage 11, and the input signal voltages applied to the collector electrodes of transistors $Q_{1a}$ and $Q_{1b}$ are varied in phase with each other, so that the output terminal $t_2$ may be regarded as being grounded from a biasing Dc voltage point of view. With the foregoing in mind, and assuming that, in the biasing circuit 12*a*, the values of resistors $R_{1a}$, $R_{2a}$, $R_{3a}$ and $R_{4a}$ of biasing circuit 12*a* respectively are $r_1$, $r_2$, $r_3$ and $r_4$, the voltage of voltage source terminal $+B_2$ is $E_{GG}$, the base-emitter voltage of transistor $Q_{1a}$ is $V_{BE}$, the forward voltage of diode $D_{1a}$ is $V_d$ and the ratio $r_2/r_1$ is K, then the DC voltage $E_o$ obtained at the collector electrode of transistor $Q_{1a}$ may be expressed as follows:

$$E_o = \left[ V_d + \frac{r_3}{r_3 + r_4}(E_{GG} - V_d) - V_{BE} \right] K \quad (1)$$

If equation (1) is partially differentiated by $E_{GG}$, the following equation is obtained:

$$\frac{\delta E_o}{\delta E_{GG}} = K \cdot \frac{r_3}{r_3 + r_4} \quad (2)$$

Further, if the amplification constant of each of the transistors $F_{1b}$ and $F_{2b}$ is $\mu$, the following equation is established as inherent in the triode characteristics of such transistors:

$$\frac{\delta E_o}{\delta E_{GG}} = \frac{1}{\mu} \quad (3)$$

By substituting equation (3) in equation (2), the following equation is obtained:

$$\mu K \cdot \frac{r_3}{r_3 + r_4} = 1 \quad (4)$$

If the values of K, $r_3$ and $r_4$ are selected so as to satisfy equations (1) and (4), the DC biasing drain current $I_{do}$ of transistors $F_{1b}$ and $F_{2b}$ can be made constant independent of voltage fluctuations at the voltage source terminal $-B_1$.

If, as in a practical example, $E_o$= 21V., $E_{GG}$=74V., $V_d$=1.3V., $V_{BE}$=0.5V. and $\mu$=8.1, the substitution of the foregoing values in equation (1) and also the substitution of $1/\mu$ K for $$\left(\frac{r_3}{r_3 + r_4}\right)$$

(from equation 4), makes it possible to solve simply for K=17.2, that is, $r_2/r_1$=17.2. Further, by substituting $\mu$=8.1 and K=17.2 in equation (4), $r_4/r_3$=138 is obtained. Therefore, in this example, if the values $r_1$ and $r_3$ for resistors $R_{1a}$ and $R_{3a}$ are selected to be 820 ohms and 270 ohms, respectively, then the values $r_2$ and $r_4$ for resistors $R_{2a}$ and $R_{4a}$ have to be approximately 14K. ohms and 37K. ohms, respectively, to provide the desired stabilization of the DC biasing drain current of transistors $F_{1b}$ and $F_{2b}$ in the face of fluctuations in their operating voltage at terminal $-B_1$.

Since the second biasing circuit 12*b* is constructed symmetrically with respect to biasing circuit 12*a*, the circuit constants of circuit 12*b* can be selected to be similar to those described above with reference to circuit 12*a*, whereby to provide the desired stabilization of the DC biasing drain current of transistors $F_{1a}$ and $F_{2a}$ in the face of fluctuations in their operating voltage at terminal $+B_1$.

In the embodiment of FIG. 6, when the voltage source circuit is switched on, the gate biasing voltages are not immediately applied to the triode-characteristic transistors $F_{1a}$, $F_{2a}$, $F_{1b}$ and $F_{2b}$ so that an excess or over-current may flow therethrough. However, if the voltage at source terminal $+B_2$ is made to rise more quickly than that at voltage source terminal $+B_1$, it is possible to control the current flow so as not to exceed the desired DC biasing drain current. In other words, if the gate biasing voltages $V_{GG}$ are made to rise more quickly than the drain voltages $V_{DD}$ and $-V_{DD}$ applied to the triode-characteristic transistors $F_{1a}$, $F_{2a}$, $F_{1b}$ and $F_{2b}$ by the voltage source terminal $+B_1$ and $-B_1$, the respective DC biasing drain currents can be prevented from becoming excessive. In this connection, it will be noted that the described biasing circuit 12 does not include any time constant circuits.

Further, it will be noted that biasing circuit 12 employing the bipolar transistor $Q_{1a}$ and $Q_{1b}$, as described above, acts as a constant current circuit so long as the voltage supplied from the voltage source terminal $+B_2$ or $-B_2$ is not changed, with the result that constant currents flow through transistors $Q_{1a}$ and $Q_{1b}$, and the respective collector electrodes provide constant voltages which are supplied through transistors $Q_{2a}$ and $Q_{2b}$ to the gate electrodes of the respective transistors $F_{1b}$, $F_{2b}$ and $F_{1a}$, $F_{2a}$. However, as previously noted, when the voltages at voltage source terminals $+B_1$ and $-B_1$ are varied, the voltages at voltage source terminals $+B_2$ and $-B_2$ are similarly varied, and hence the gate biasing voltages are changed so as to cancel the fluctuation of the DC biasing drain currents due to the voltage fluctuations at terminals $+B_1$ and $-B_1$. Consequently, the DC biasing drain currents of the transistors $F_{1a}$, $F_{2a}$, $F_{1b}$ and $F_{2b}$ are stabilized.

It will be apparent that the transistors $Q_{2a}$ and $Q_{2b}$, which are provided for impedance conversion, may be theoretically omitted from the biasing circuits 12*a* and 12*b* without affecting the operation of the latter in stabilizing the DC biasing drain currents of the triode-characteristic field effect transistors in output stage 13. Further, although the output stage 13 is shown to include a pair of triode-characteristic field effective transistors $F_{1a}$ and $F_{2a}$ connected in parallel with each other and in push-pull relation to the other pair of parallel connected triode-characteristic field effect transistors $F_{1b}$ and $F_{2b}$, the circuit 12 may be associated with an output stage having additional triode-characteristic field transistors connected in parallel with transistors $F_{1a}$ and $F_{2a}$ and with transistors $F_{1b}$ and $F_{2b}$, respectively, or with an output stage having only the transistors $F_{1a}$ and $F_{1b}$ in push-pull relationship. Further, the present invention can be applied to an amplifier having only a single triode-characteristic field effect transistor, for example, the transistor $F_{1a}$, in association with a suitable biasing circuit, such as the biasing circuit 12*b*.

In accordance with this invention, a transistor amplifier, as described above, is provided with a detecting circuit 14 which functions to detect the current and voltage of load $Z_L$, that is, the load impedance, and a switching circuit 15 which is normally opened or non-conductive, but which is closed or rendered conductive by detecting circuit 14 when the latter detects a predetermined reduction of the load impedance, for example, to about 1 ohm or less, so as to shunt the input signal from driving stage 11 directly to load $Z_L$ and thereby protect the triode characteristic field effect transistors $F_{1a}$, $F_{2a}$, $F_{1b}$ and $F_{2b}$ of output stage 13 from damage due to overloading thereof.

The switching circuit 15 consists simply of a PNP-type switching transistor $Q_{3a}$ and NPN-type switching transistor $Q_{3b}$. The emitter electrodes of transistors $Q_{3a}$ and $Q_{3b}$ are connected to output terminal $t_2$ of the driving stage or amplifier 11 through diodes $D_{2a}$ and $D_{2b}$, respectively, which are used for preventing Zener breakdown of the respective transistors $Q_{3a}$ and $Q_{3b}$, and the collector electrodes of the latter are respectively connected to the output terminal $t_3$ of output stage 13. So long as the impedance of load $Z_L$, as detected by circuit 14, is above a predetermined value, transistors $Q_{3a}$ and $Q_{3b}$ are turned OFF or non-conductive, with the result that the signal at output terminal $t_2$ of driving stage amplifier 11 is normally applied, as the input, to triode characteristic field effect transistors $F_{1a}$, $F_{2a}$, $F_{1b}$ and $F_{2b}$ of output stage amplifier 13 for further amplifying thereby prior to being applied to output terminal $t_3$. However, when the detected load impedance falls below such predetermined value, circuit 14 causes transistors $Q_{3a}$ and $Q_{3b}$ to be turned ON or rendered conductive, as hereinafter described, with the result that switching circuit 15 is closed for shunting the signal from output terminal $t_2$ of driving stage 11 to output terminal $t_3$ of output stage 13.

The detecting circuit 14 is shown to be generally composed of a first detecting circuit 14*a* for detecting the current of load $Z_L$ as the drain currents of transistors $F_{1a}$ and $F_{2a}$ and a second detecting circuit 14b for detecting the current of load $Z_L$ as the drain currents of transistors $F_{1b}$ and $F_{2b}$.

In the first detecting circuit 14*a*, an NPN-type controlling transistor $Q_{4a}$ has its collector electrode connected to the base electrode of transistor $Q_{3a}$ in switching circuit 15 and the emitter electrode of transistor $Q_{4a}$ is connected to output terminal $t_3$. A capacitor $C_{3a}$ is connected between the base electrode of transistor $Q_{4a}$ and output terminal $t_3$. The source electrodes of transistors $F_{1a}$ and $F_{2a}$ are connected to the anodes of rectifying diodes $D_{4a}$ and $D'_{4a}$, respectively, while the cathodes of such diodes are connected through a resistor $R_{8a}$ to the base electrode of transistor $Q_{4a}$. Further, the base electrode of transistor $Q_{4a}$ is connected to the anode of a rectifying diode $D_{3a}$ while the cathode of the latter is grounded through a resistor $R_{7a}$.

In the second detecting circuit 14*b*, a PNP-type controlling transistor $Q_{4b}$ has its collector electrode connected to the base electrode of transistor $Q_{3b}$ in switching circuit 15 and the emitter electrode of transistor $Q_{4b}$ is connected to output terminal $t_3$. A capacitor $C_{3b}$ is connected between the base electrode of transistor $Q_{4b}$ and output terminal $t_3$. The source electrodes of transistors $F_{1b}$ and $F_{2b}$ are connected to the cathodes of rectifying diodes $D_{4b}$ and $D'_{4b}$, respectively, while the anodes of the latter are connected through a resistor $R_{8b}$ to the base electrode of transistor $Q_{4b}$. Further, the base electrode of transistor $Q_{4b}$ is connected to the cathode of a rectifying diode $D_{3b}$ while the anode of the latter is grounded through a resistor $R_{7b}$.

The first and second detecting circuits 14*a* and 14*b* and the transistors $Q_{3a}$ and $Q_{3b}$ of switching circuit 15 are symmetrical with respect to output terminal $t_3$ of output stage amplifier 13 and operate similarly so that only the operation of detecting circuit 14*a* will be described in detail.

When transistors $F_{1a}$ and $F_{2a}$ are supplied with the half cycle component of a signal appearing at output terminal $t_2$ of the driving stage amplifier 11, resistors $R_{9a}$ and $R_{10a}$ are adapted to detect the current through load $Z_L$. That is, the voltages across resistors $R_{9a}$ and $R_{10a}$ are rectified by diodes $D_{4a}$ and $D'_{4a}$, respectively, and supplied to one end of capacitor $C_{3a}$ (at the base electrode side of the transistor $Q_{4a}$), and the voltage across load $Z_L$ is supplied to the other end of capacitor $C_{3a}$ (at the emitter electrode sidde of the transistor $Q_{4a}$) by a closed loop constituted by resistor $R_{7a}$, diode $D_{3a}$, capacitor $C_{3a}$ and load $Z_L$.

When the impedance of load $Z_L$ has a normal value, the voltage across the load $Z_L$ is higher than the ground potential, and hence the emitter potentiala of transistor $Q_{4a}$ is also high. In addition, amplified output signals are obtained at the source electrodes of transistors $F_{1a}$ and $F_{2a}$ and the capacitor $C_{3a}$ is temporarily charged by these amplified signals. However, such electric charge is immediately discharged through diode $D_{3a}$ and resistor $R_{7a}$ and, thereafter, the above charging and discharging operation is repeated. As a result, the voltage required for turning ON transistor $Q_{4b}$ does not appear between the base and emitter electrodes of transistor $Q_{4a}$. Accordingly, transistor $Q_{3a}$ of switching circuit 15 is kept in its OFF state and, hence, transistors $F_{1a}$ and $F_{2a}$ perform their normal amplifying functions.

When the impedance of load $Z_L$ is lowered to a predetermined value, for example, 1 ohm or less, due to a short-circuit or the like, the voltage across the load is also lowered and hence the emitter potential of transistor $Q_{4a}$ is extremely lowered. Further, such lowering of the impedance of load $Z_L$ causes a large DC current to flow through load $Z_L$, so that the voltages across resistors $R_{9a}$ and $R_{10a}$ increases correspondingly, and thus capacitor $C_{3a}$ is charged with increased voltages through diodes $D_{4a}$ and $D'_{4a}$ and the increased charge on capacitor $C_{3a}$ is only slightly discharged through diode $D_{3a}$ and resistor $R_{7a}$. For this reason, the base potential of transistor $Q_{4a}$ is also increased to turn ON transistor $Q_{4a}$, so that transistor $Q_{3a}$ is also turned ON to supply the signal from the output terminal $t_2$ of the driving stage amplifier 11 directly to output terminal $t_3$ of the output stage amplifier 13 through diode $D_{2a}$ and transistor $Q_{3a}$. As a result, the gate-source voltage of each transistor $F_{1a}$ and $F_{2a}$ is fixed at the biasing voltage (a voltage similar to the pinch-off voltage) which is equivalent to removing the signal at the output terminal $t_2$ of driving stage amplifier 11 from transistors $F_{1a}$ and $F_{2a}$ of output stage amplifier 13.

Therefore, the drain currents of transistors $F_{1a}$ and $F_{2a}$ are immediately suppressed to a minimum value determined by the biasing voltage thereof to prevent these transistors $F_{1a}$ and $F_{2a}$ from being damaged due to the increase of the load currents, that is, the drain losses. In other words, in detecting circuit 14*a*, transistor $Q_{3a}$ is adapted to be turned ON when the load current is increased to enhance the base potential of the transistor $Q_{4a}$, or when the voltage across the load $Z_L$ is decreased to lower the emitter potential of transistor $Q_{4a}$, that is, when the load impedance is lowered to a predetermined value or less.

As previously indicated, detecting circuit 14*b* operates similarly to detecting circuit 14*a* for preventing damage to transistors $F_{1b}$ and $F_{2b}$ when the load impedance or current is seriously altered, as by a short circuit.

By way of summary, it will be noted that, in accordance with this invention, an amplifier having an amplifying element, preferably in the form of a field effect transistor, adapted to have a voltage similar to its pinch-off voltage applied between its gate and source electrodes, is provided with a detecting circuit 14 for detecting a load current of the amplifier 13, and a normally opened or non-conductive switching circuit 15 which is controlled by the detected output of the detecting circuit 14 to supply at least part of the input signal of the amplifier 13 directly to a load $Z_L$. With the above arrangement, when the load current increaases above a predetermined value, the normally opened or non-conductive switching circuit 15 is closed or made conductive to fix the gate-source voltage of the field effect transistor $F_{1a}$, $F_{2a}$, $F_{1b}$ or $F_{2b}$ at the value of the biasing voltage, with the result that a protective circuit for the field effect transistor is provided. Accordingly, the aforementioned field effect transistor acting as amplifying element of the amplifier 13 can be protected from damage due to an excess load current.

As previously mentioned, the load impedance is also detected by the detecting circuit 14 and, when the detected inpedance is lowered below a predeterminned value, the normally opened switching circuit 15 is closed. In this connection, it should be noted that even though the load current is quite large, if the load impedance is not extremely small, for example, as a result of being short-circuited or the like, the amplifying operation of the field effect transistors $F_{1a}$, $F_{2a}$, $F_{1b}$ and $F_{2b}$ will not be halted. When the load has a large reactance component in addition to a resistive component, for example, as in the case of a condenser speaker, merely increasing the load current causes only a quite temporary increase in the loss of the field effect transistors $F_{1a}$, $F_{2a}$, $F_{1b}$ and $F_{2b}$ above an allowable value, and there is no danger that the field effect transistors will be damaged. Accordingly, with the described detecting circuit 14, there is no possibility that the field effect transistors will be overly protected and that the supply of an amplified output signal to the load will be unnecessarily stopped.

In the above described embodiment of FIG. 6, the emitter electrodes of transistors $Q_{3a}$ and $Q_{3b}$ of the normally opened or non-conductive switching circuit 15 are connected to the output terminal $t_2$ of the driving stage amplifier 11 through diodes $D_{2a}$ and $D_{2b}$, respectively. However, if desired, resistor $R_5$ connected between the emitter electrodes of transistors $Q_{2a}$ and $Q_{2b}$ in biasing circuit 12 may be provided with an intermediate movable terminal or tap to which the emitter electrodes of transistors $Q_{3a}$ and $Q_{3b}$ are alternatively connected through diodes $D_{2a}$ and $D_{2b}$, respectively. In that case, the intermediate movable terminal or tap on resistor $R_5$ may be adjusted to establish the zero potential point, that is, to achieve balance in a DC manner.

In another modification, a resistor (not shown) with an intermediate movable terminal or tap may be interposed between resistors $R_{2a}$ and $R_{2b}$ of biasing circuit 12, with such movable terminal or tap being connected to output terminal $t_2$ of the driving stage amplifier 11 and also connected, through diodes $D_{2a}$ and $D_{2b}$, to the emitter electrodes of transistors $Q_{3a}$ and $Q_{3b}$. With the foregoing modification, if the movable terminal is adjusted so as to control the bias at the output terminal $t_2$ of the driving stage amplifier 11 and this adjusted bias is established as the zero potential point, the DC bias becomes more stable.

In the above described embodiment of the invention, field effect transistors having triode characteristics have been used as the amplifying elements in output stage 13. However, it will be understood that junction-type or MOS-type field effect transistors having pentode characteristics can also be used in amplifiers having the protective circuit according to this invention.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A transistor amplifier comprising: a voltage source for supplying an operating voltage; at least a first field effect transistor having gate, source and drain electrodes; means for applying said operating voltage across said drain and source electrodes through a load; input circuit means for applying an input signal to be amplified to said gate electrode of the field effect transistor; biasing circuit means for applying a predetermined gate bias voltage to said gate electrode; and protective circuit means for preventing overloading of said field effect transistor including detecting means for detecting an overload condition of said field effect transistor, and shunting means controlled by said detecting means and being operative when the latter detects said overload condition to shunt said input signal directly to said load while said field effect transistor continues to have said predetermined gate bias voltage applied thereto.

2. A transistor amplifier according to claim 1; in which said detecting means is responsive to the impedance of said load for detecting said overload condition.

3. A transistor amplifier according to claim 2; in which said detecting means includes first rectifying circuit means for rectifying a voltage corresponding to the current flowing through said load, second rectifying circuit means for rectifying a voltage corresponding to the voltage across said load, and means responsive to the voltage difference between output voltages of said first and second rectifying circuit means, which difference is representative of the load impedance, for operating said shunting means when said voltage difference attains a predetermined value.

4. A transistor amplifier according to claim 2; in which said detecting means includes a first resistor connected in series with the drain-source current path of said field effect transistor, a capacitor, a first diode and a second resistor connected between said first resistor and said capacitor for applying to the latter a first DC voltage of one polarity which is proportional to the voltage across said first resistor, a second diode and a third resistor connected between said capacitor and the load for applying to said capacitor a second DC voltage of the opposite polarity which is proportional to the voltage across said load so that the DC voltage across said capacitor is proportional to the impedance of said load, and means responsive to said DC voltage across the capacitor for operating said shunting means when said DC voltage across the capacitor is indicative of a predetermined low value of the load impedance.

5. A transistor amplifier according to claim 4; in which said means responsive to the DC voltage across said capacitor includes a switching transistor having first, second and third electrodes, and said first and second electrodes are connected across said capacitor to provide a control signal at said third electrode for operating said shunting means when said DC voltage across said capacitor exceeds a predetermined value.

6. A transistor amplifier according to claim 5; in which said shunting means includes a shunting transistor having a normally non-conductive output circuit connected between said input means and said load, and a control electrode connected with said third electrode of the switching transistor for making said output circuit conductive in response to said control signal.

7. A transistor amplifier according to claim 1; in which said field effect transistor has triode characteristics.

8. A transistor amplifier according to claim 7; in which a second triode characteristic field effect transistor is connected in parallel relationship to said first field effect transistor.

9. A transistor amplifier according to claim 7; in which said biasing circuit means includes compensating means for varying said gate bias voltage in response to voltage fluctuations in said operating voltage so as to stabilize the biasing DC drain current of the triode characteristic field effect transistor.

10. A transistor amplifier according to claim 9; in which said compensating means varies said gate bias voltage by an amount that is $1\mu$ times the voltage fluctuation in said operating voltage with $\mu$ being the amplification constant of said triode characteristic field effect transistor.

11. A transistor amplifier according to claim 9; in which said compensating means includes a plurality of interconnected resistors, means for applying to said interconnected resistors a voltage which fluctuates with said fluctuations of said operating voltage, and means for applying the voltage across one of said resistors to said gate electrode as said gate bias voltage for the triode characteristic field effect transistor; and in which said interconnected resistors have resistance values which are selected so that said voltage across said one resistor varies in response to said fluctuations in the operating voltage by amounts that are $1/\mu$ times said fluctuations, with $\mu$ being the amplification constant of said triode characteristic field effect transistor.

12. A transistor amplifier according to claim 11; in which said biasing circuit means further includes a transistor having first, second and third electrodes, and constant voltage means; and in which said resistors include first and second resistors, one of which is said one resistor, and third and fourth resistors, said voltage which fluctuates with said fluctuations of the operating voltage is applied across said first and second electrodes through said first and second resistors, respectively, said third and fourth resistors are connected with said constant voltage means in a series circuit to which said voltage which fluctuates with said fluctuations of the operating voltage is also applied, and said third electrode is connected to said series circuit between said third and fourth resistors.

13. A transistor amplifier according to claim 12; in which said first, second, third and fourth resistors have respective resistance values $r_1$, $r_2$, $r_3$ and $r_4$ selected to satisfy the followint equation:

$$\mu\,(r_2/r_1)\cdot\left(\frac{r_3}{r_3+r_4}\right)=1$$

in which $\mu$ is said amplification constant of said triode characteristic field effect transistor.

14. A transistor amplifier according to claim 1; in which said biasing circuit means includes a biasing transistor having a control electrode and an output circuit, a resistor connected in a series circuit with said output circuit, means for applying a voltage proportional to said operating voltage to said series circuit, means connected with said control electrode for biasing said biasing transistor as a constant current transistor, and means for applying a DC voltage across said resistor to said gate electrode to serve as said gate bias voltage for the field effect transistor.

15. A transistor amplifier according to claim 14; in which said means connected with the control electrode of said biasing transistor includes a constant voltage circuit.

16. A transistor amplifier according to claim 1; further comprising a second field effect transistor also having gate, source and drain electrodes, and means for applying said operating voltage across said drain and source electrodes of said second field effect transistor through said load; and in which said input circuit means applies said input signal to said gate electrode of said second field effect transistor so as to drive said first and second field effect transistors with a push-pull relationship therebetween, said biasing circuit means also applies a second predetermined gate bias voltage to said gate electrode of the second field effect transistor, said detecting means is effective to detect said overload condition of either of said first and second field effect transistors, and said shunting means is operative when said detecting means detects said overload condition of either of said first and second field effect transistors.

17. A transistor amplifier according to claim 16; in which each of said first and second field effect transistors has triode characteristics.

18. A transistor amplifier according to claim 17; in which said first and second triode characteristic field effect transistors have complementary conductivities, respectively, and said operating voltage applied across said drain and source electrodes of said first field effect transistor through a load has its polarity reversed in respect to the polarity of said operating voltage as applied across said drain and source electrodes of said second field effect transistor through said load.

19. A transistor amplifier according to claim 17; further comprising third and fourth triode characteristic field effect transistors each having gate, drain and source electrodes; and in which said gate, drain and source electrodes of said third and fourth field effect transistors are connected with said gate, drain and source electrodes of said first and second field effect transistors, respectively.

20. A transistor amplifier according to claim 17; in which said biasing circuit means includes compensating means for varying said gate bias voltage applied to each of said field effect transistors in response to voltage fluctuations in the respective operating voltage so as to stabilize the biasing DC drain current of each of said first and second triode characteristic field effect transistors.

21. A transistor amplifier according to claim 20; in which said compensating means varies each of the gate bias voltages by an amount that is $1/\mu$ times the voltage fluctuation of said operating voltage for said first and second triode characteristic field effect transistors, with $\mu$ being the amplification constant of said first and second field effect transistors.

22. A transistor amplifier according to claim 20; in which said compensating means includes first and second sets of interconnected resistors, means for applying to said first and second sets of interconnected resistors respective voltages which fluctuate with said fluctuations of the operating voltage applied across said drain and source electrodes of said first and second triode characteristic field effect transistors, respectively, and means for applying the voltage across one of said resistors of said first and second sets to said gate electrode of said first and second triode characteristic field effect transistors, respectively, as the respective gate bias voltages; and in which said interconnected resistors of said first and second sets have resistance values which are related so that said voltage across said one resistor of each of said sets varies in response to said fluctuations in the respective operating voltage by amounts that are $1/\mu$ times said fluctuations, with $\mu$ being the amplification constant of each of said first and second triode characteristic field effect transistors.

23. A transistor amplifier according to claim 22; in which said biasing circuit means further includes a first transistor having first, second and third electrodes and a first constant voltage means associated with said first set of interconnected resistors, and a second transistor having first, second and third electrodes and a second constant voltage means associated with said second set of interconnected resistors; said voltage source has a point of reference potential, and first, second, third and fourth terminals, with the operating voltages for said first and second triode characteristic field effect transistors appearing between said first and second terminals, respectively, and said point of reference potential, and with said voltages which fluctuate with said fluctuations of the operating voltages applied to said first and second triode characteristic field effect transistors, respectively, appearing between said third and fourth terminals, respectively, and said point of reference potential; each of said first and second sets of resistors includes first and second resistors, one of which is said one resistor, and third and fourth resistors; and in which said first resistors of said first and second sets are connected between said first electrodes of said first and second transistors and said third and fourth terminals, respectively, said second resistors of said first and second sets are connected between said second electrodes of said first and second transistors and said point of reference potential, said third resistors of said first and second sets are connected in series with said first and second constant voltage means, respectively, between said third electrode of said first transistor and said third terminal, and between said third electrode of said second transistor and said fourth terminal, respectively, and said fourth resistors of said first and second sets are connected in series between said third electrodes of said first and second transistors, respectively.

24. A transistor amplifier according to claim 23; in which said first, second, third and fourth resistors of each of said sets have respective resistance values $r_1$, $r_2$, $r_3$ and $r_4$ selected to satisfy the equation $$\mu\,(r_2/r_1)\cdot\left(\frac{r_3}{r_3+r_4}\right)=1$$

in which $\mu$ is said amplification constant of the respective triode characteristic field effect transistor.

25. A transistor amplifier according to claim 23; in which said fourth resistor of one of said sets is variable for relatively adjusting the gate bias voltages applied to the gate electrodes of said first and second triode characteristic field effect transistors.

26. A transistor amplifier according to claim 16; in which said detecting means includes, for each of said first and second field effect transistors, first rectifying circuit means for rectifying a voltage corresponding to the current flowing through said load, second rectifying circuit means for rectifying a voltage corresponding to the voltage across said load, and means responsive to the voltage difference between output voltages of said first and second rectifying circuit means, which difference is representative of the load impedance, for operating said shunting means when said voltage difference attains a predetermined value.

27. A transistor amplifier according to claim 16; in which said detecting means includes, for each of said first and second field effect transistors, a first resistor connected in series with the drain-source current path of the respective field effect transistor, a capacitor, a first diode and a second resistor connected between said first resistor and said capacitor for applying to the latter a first DC voltage of one polarity which is proportional to the voltage across said first resistor, a second diode and a third resistor connected between said capacitor and the load for applying to said capacitor and the load for applying to said capacitor a second DC voltage of the opposite polarity which is proportional to the voltage across said load so that the DC voltage across said capacitor is proportional to the impedance of said load, and means responsive to said DC voltage across the capacitor for operating said shunting means when said DC voltage across the capacitor is indicative of a predetermined low value of the load impedance.

28. A transistor amplifier according to claim 27; in which said means responsive to the DC voltage across said capacitor includes a switching transistor having first, second and third electrodes, and said first and second electrodes are connected across said capacitor to provide a control signal at said third electrode for operating said shunting means when said DC voltage across said capacitor exceeds a predetermined value.

29. A transistor amplifier according to claim 28; in which said shunting means includes a shunting transistor having a normally non-conductive output circuit connected between said input circuit means and said load, and a control electrode connected with said third electrode of the switching transistor for making said output circuit conductive in response to said control signal.

* * * * *